United States Patent
Rafael et al.

(10) Patent No.: US 10,468,395 B2
(45) Date of Patent: Nov. 5, 2019

(54) DEVICE INCLUDING AT LEAST ONE OPTOELECTRONIC SEMICONDUCTOR COMPONENT

(71) Applicant: OSRAM Opto Semiconductors GmbH, Regensburg (DE)

(72) Inventors: Christine Rafael, Donaustauf (DE); Korbinian Perzlmaier, Regensburg (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 15/778,645

(22) PCT Filed: Nov. 22, 2016

(86) PCT No.: PCT/EP2016/078451
§ 371 (c)(1),
(2) Date: May 24, 2018

(87) PCT Pub. No.: WO2017/089349
PCT Pub. Date: Jun. 1, 2017

(65) Prior Publication Data
US 2018/0350788 A1    Dec. 6, 2018

(30) Foreign Application Priority Data

Nov. 27, 2015    (DE) .................. 10 2015 120 642

(51) Int. Cl.
  *H01L 25/16*    (2006.01)
  *H01L 33/48*    (2010.01)
  (Continued)

(52) U.S. Cl.
  CPC .......... *H01L 25/167* (2013.01); *H01L 33/486* (2013.01); *H01L 33/52* (2013.01); *H01L 25/0753* (2013.01)

(58) Field of Classification Search
  CPC . H01L 25/167; H01L 25/0753; H01L 27/156; H01L 27/153; H01L 27/144;
  (Continued)

(56) References Cited

U.S. PATENT DOCUMENTS 8,916,901 B2 * 12/2014 Kimura ................. H01L 25/167
                                                         257/98
9,755,127 B2 *  9/2017 Shimojuku ............. H01L 33/62
(Continued)

FOREIGN PATENT DOCUMENTS

DE    10 2012 102 847 A1   10/2013
EP           2 701 214 A1    2/2014
(Continued)

*Primary Examiner* — Dao H Nguyen
(74) *Attorney, Agent, or Firm* — DLA Piper LLP (US)

(57) ABSTRACT

A device includes a plurality of optoelectronic semiconductor components and a connection carrier on which the optoelectronic semiconductor components are arranged, wherein the optoelectronic semiconductor components each have a semiconductor body including an active region configured to generate and/or receive radiation; the optoelectronic semiconductor components have a molded body through which a first electrical contact and a second electrical contact to electrically contact the semiconductor bodies are fed; the molded body has a side face delimiting the semiconductor components in a lateral direction; and the connection carrier and the side face of the molded body are covered at least in regions by a radiation-impermeable cover layer.

15 Claims, 5 Drawing Sheets (51) Int. Cl.
*H01L 33/52* (2010.01)
*H01L 25/075* (2006.01)

(58) Field of Classification Search
CPC . H01L 27/0248; H01L 29/861; H01L 33/486;
H01L 33/647; H01L 33/44; H01L 33/52;
H01L 33/62
USPC .............. 257/646, 432, 433, 76, 91, 98, 99;
438/26, 27, 29, 46, 64, 72
See application file for complete search history.

(56) References Cited

U.S. PATENT DOCUMENTS

| | | |
|---|---|---|
| 2011/0049545 A1 | 3/2011 | Basin et al. |
| 2011/0266578 A1 | 11/2011 | Kaisawa et al. |
| 2011/0297969 A1* | 12/2011 | Kojima .................. H01L 33/46 257/88 |
| 2012/0241793 A1 | 9/2012 | In et al. |
| 2013/0187192 A1* | 7/2013 | Hoeppel ........... H01L 31/02005 257/99 |

FOREIGN PATENT DOCUMENTS

| | | |
|---|---|---|
| WO | 2017/009332 A1 | 1/2017 |
| WO | 2017/017209 A1 | 2/2017 |

* cited by examiner

DEVICE INCLUDING AT LEAST ONE OPTOELECTRONIC SEMICONDUCTOR COMPONENT

TECHNICAL FIELD

This disclosure relates to a device comprising at least one optoelectronic semiconductor component.

BACKGROUND

For lighting applications, radiation-emitting semiconductor components such as light-emitting diodes are often mounted on printed circuit boards. Depending on the housing design of the light-emitting diodes, increased undesired aging can occur, which can in particular also be caused by the radiation radiated by the light-emitting diodes themselves. For example, in epoxy materials, comparatively strong light-induced aging occurs. Additives such as radical scavengers can be admixed with the material to delay the light-induced aging of epoxides. The additives are consumed, however, so that this can only cause a delay in the aging process.

It could therefore be helpful to provide a device distinguished by high aging stability and that can at the same time be produced in a simple and cost-effective manner.

SUMMARY

We provide a device including a plurality of optoelectronic semiconductor components and a connection carrier on which the optoelectronic semiconductor components are arranged, wherein the optoelectronic semiconductor components each have a semiconductor body including an active region configured to generate and/or receive radiation; the optoelectronic semiconductor components have a molded body through which a first electrical contact and a second electrical contact to electrically contact the semiconductor bodies are fed; the molded body has a side face delimiting the semiconductor components in a lateral direction; and the connection carrier and the side face of the molded body are covered at least in regions by a radiation-impermeable cover layer.

LIST OF REFERENCE SIGNS 1 device
2 semiconductor component
20 semiconductor body
200 side face of the semiconductor body
21 first semiconductor layer
22 second semiconductor layer
23 active region
231 first segment
232 second segment
24 further semiconductor layer
25 recess
26 separating trench
27 lower side
28 radiation passage face
29 structuring
3 radiation conversion element
30 side face of the radiation conversion element
4 molded body
40 side face of the molded body
41 upper edge
51 first contact face
52 second contact face
55 first electrical contact
551 first contact layer
56 second electrical contact
561 second contact layer
59 internal connection
6 insulation layer
65 blocking layer
651 dielectric layer
652 dielectric mirror
653 mirror layer
7 cover layer
75 filling layer
8 connecting means
9 connection carrier
91 first connection face
92 second connection face
95 region

DETAILED DESCRIPTION

Our device has at least one optoelectronic semiconductor component. In particular, the device can have a plurality of optoelectronic semiconductor components.

The optoelectronic semiconductor component may comprise a semiconductor body. The semiconductor body can in particular have an active region that generates and/or receives radiation. By way of example, the semiconductor body comprises an in particular epitaxially deposited semiconductor layer sequence including the active region. For example, the active region is arranged between a first semiconductor layer of a first conductivity type and a second semiconductor layer of a second conductivity type different from the first conductivity type. In the vertical direction, the semiconductor body is delimited, for example, by a radiation passage face and a bottom side lying opposite the radiation passage face. A vertical extent of the semiconductor body is, for example, 2 μm to 20 μm.

A direction running perpendicular to a main plane of extension of the active region is regarded as the vertical direction. Accordingly, a direction running parallel to the main plane of extension of the active region is regarded as a lateral direction.

The optoelectronic semiconductor component may have a first electrical contact and a second electrical contact that electrically contacts the semiconductor body. In a radiation emitter, the first electrical contact and the second electrical contact are provided to inject charge carriers from opposite sides into the active region during operation of the semiconductor component so that the charge carriers can recombine in the active region to emit the radiation. In a radiation receiver, charge carrier pairs generated in the active region by absorption of radiation and separated from one another and can be tapped off externally via the first electrical contact and the second electrical contact.

The first electrical contact and the second electrical contact are preferably arranged on the same side of the semiconductor body, in particular on a side of the semiconductor body facing away from a radiation passage face so that the radiation passage face is free of external electrical contacts.

The optoelectronic semiconductor component may have a molded body. The molded body is provided in particular to mechanically stabilize the semiconductor body. The molded body is produced, for example, by a casting method.

A casting method is generally understood to mean a method by which a molding compound can be formed in accordance with a predetermined shape and can be cured if necessary. In particular, the term "casting method" encompasses casting, film-assisted molding, injection molding, transfer molding and compression molding.

The first electrical contact and the second electrical contact may pass through the molded body, in particular in the vertical direction. The first electrical contact and the second electrical contact are accessible in particular on a side of the molded body facing away from the semiconductor body for external electrical contacting of the semiconductor component.

The molded body may have a side face delimiting the semiconductor component in the lateral direction. The molded body can, in particular, also form all side faces of the semiconductor component in regions.

The device may have a connection carrier on which the at least one optoelectronic semiconductor component is arranged. For example, the connection carrier has a first connection face and a second connection face electrically conductively connected to the first electrical contact and the second electrical contact, respectively. For example, the connection carrier is a circuit board, for example, a printed circuit board.

The connection carrier and/or the side face of the molded body may be covered at least in regions by a cover layer. In particular, the entire side face of the molded body can be covered by the cover layer. Furthermore, the cover layer can surround the molded body in the lateral direction along its entire circumference. For example, the cover layer extends in the vertical direction from the connection carrier at least as far as an upper edge of the molded body. In particular, an outer border of the molded body having the greatest distance from the connection carrier is regarded as the upper edge. In particular, the cover layer can extend in the vertical direction beyond the upper edge of the molded body.

In particular, the cover layer is impermeable to radiation generated or to be received by the optoelectronic semiconductor component. Radiation generated by the device and reflected back, for example, or radiation generated by an adjacent optoelectronic component of the optoelectronic device is thus prevented from striking the molded body by the cover layer. The radiation passage face of the semiconductor body is expediently free of the cover layer.

The device may comprise at least one optoelectronic semiconductor component arranged on a connection carrier. The optoelectronic semiconductor component has a semiconductor body having an active region that generates and/or receives radiation. The optoelectronic semiconductor component has a molded body through which a first electrical contact and a second electrical contact extend to electrically contact the semiconductor body. The molded body has a side face delimiting the semiconductor component in a lateral direction. The connection carrier and the side face of the molded body are covered at least in regions by a radiation-impermeable cover layer.

The molded body is thus protected from the radiation by the cover layer. Radiation-induced aging effects such as, for example, a discoloration or a reduction in mechanical stability can be avoided or at least reduced. In particular, for the molded body, a material can also be used which itself has only a comparatively low radiation stability, in particular a lower radiation stability than the covering layer. For example, the material of the molded body can be selected with regard to other properties, for example, with regard to high temperature stability, good processability by a casting method and/or low-cost availability. For example, the molded body contains an epoxy material.

The cover layer may have a reflectivity of at least 60% for the radiation generated or to be received in the active region during operation, preferably at least 80%, in particular a reflectivity of at least 90%. The higher the reflectivity of the cover layer, the better the avoidance of absorption losses on the cover layer. For example, the cover layer contains a material admixed with white pigments such as titanium dioxide particles.

The side face of the molded body covered by the cover layer along an entire circumference of the molded body. In other words, the cover layer covers the molded body at all side faces, in particular completely. By the cover layer, the molded body can be completely protected from radiation impinging laterally on the molded body.

A radiation conversion element may be arranged on the semiconductor body, the radiation conversion element being provided for at least partial conversion of the radiation generated in the active region. For example, the radiation conversion element contains a photoluminescent material.

For example, the radiation conversion element can convert the primary radiation with a first peak wavelength generated in the active region into secondary radiation having a second peak wavelength different from the first peak wavelength so that the device radiates only the secondary radiation or a mixed radiation from the secondary radiation and the primary radiation.

In particular, the cover layer can surround the radiation conversion element at least in regions, preferably along the entire circumference, in the lateral direction. For example, the cover layer covers a side face of the radiation conversion element along the entire circumference. By the cover layer, it can be avoided that radiation laterally exits the radiation conversion element. These laterally emerging radiation components would on average travel a longer optical path through the radiation conversion element than radiation passing through the radiation conversion element in the vertical direction so that the laterally emerging radiation would have a higher proportion of secondary radiation. The homogeneity of the color locus of the radiation, depending on the emission angle, emitted by the device can thus be improved by the cover layer. A predetermined color locus of the radiation emitted during operation can be reliably and reproducibly adjusted in a simplified manner.

The device may comprise a connecting means via which the first electrical contact electrically conductively connects to a first connection face of the connection carrier and the second electrical contact electrically conductively connects to a second connection face of the connection carrier. The connecting means can contain, for example, an adhesive or a solder material.

The cover layer may adjoin the connecting means in places. In particular, the cover layer can completely cover the connecting means so that the connecting means is not visible in a plan view of the device.

Alternatively, the cover layer is formed by the connecting means. For example, the connecting means is an anisotropically conductive connecting means. The connecting means is thus formed during production of the device such that it covers the side face of the molded body at least in regions. In this case, a separate cover layer can be dispensed with in addition to the connecting means.

The connection carrier may be freely accessible from the cover layer in at least one region, in particular in a plan view of the device. In this case, the connection carrier is not completely covered by the cover layer laterally of the optoelectronic semiconductor component or, if appropriate, of the optoelectronic semiconductor components. For example, the cover layer is designed such that it completely surrounds the optoelectronic semiconductor component or optionally the optoelectronic semiconductor components on the connection carrier in the lateral direction. In other words, the cover layer can be subdivided into partial regions spaced apart from one another.

For example, the device has a filling layer adjoining the region which is free of the covering layer. The filling layer can be radiation-transmissive or radiation-impermeable.

A base area of the molded body in a plan view of the optoelectronic semiconductor component may be at most 50%, preferably by at most 20%, greater than a base area of the semiconductor body. The optoelectronic semiconductor component is thus distinguished by a particularly compact design, in particular compared to a design in which a semiconductor chip is inserted into a prefabricated housing (also referred to as a premold housing).

A blocking layer may be arranged at least in regions between the semiconductor body and the molded body. The blocking layer is provided to avoid or at least to reduce an impinging of the radiation generated in the active region on the face of the molded body facing the semiconductor body.

The blocking layer can in particular also be designed to be reflective for the radiation generated in the active region, for example, with a reflectivity of at least 60%, preferably with a reflectivity of at least 80%, in particular with a reflectivity of at least 90%.

The blocking layer may surround the semiconductor body at least in places in the lateral direction, in particular along the entire circumference.

The blocking layer may adjoin the cover layer at least in places. The molded body can be protected particularly efficiently against the impingement of radiation by the blocking layer and the cover layer both being arranged on the side of the molded body facing the semiconductor body and on the side face of the molded body facing away from the semiconductor body.

The molded body may surround the semiconductor body at least in places in the lateral direction. In the vertical direction, the molded body thus protrudes beyond an underside of the semiconductor body facing the molded body. In other words, the upper edge of the molded body runs at the level of the semiconductor body. In particular, the upper edge of the molded body runs between the underside of the semiconductor body and the radiation passage face.

A side face of the semiconductor body may be completely free of the molded body. In this case, the molded body can be arranged exclusively below the underside of the semiconductor body. In other words, the upper edge of the molded body, viewed along the vertical direction, is at most on a level with the underside of the semiconductor body.

The molded body may contain an epoxy material. An epoxy material is characterized by high temperature stability, simple processability and low-cost availability. For example, a black epoxy widely used for the production of electronic components is suitable.

The cover layer may comprise a silicone, a particle-filled glass or an inorganic-organic hybrid material, for example, an inorganic-organic hybrid polymer material. The materials are characterized by a high aging stability and also have a high reflectivity by adding particles such as white pigments.

Further features, refinements and expediencies emerge from the following description of examples in conjunction with the figures.

Identical, similar or identically acting elements are provided with the same reference signs in the figures.

The figures are in each case schematic representations and are therefore not necessarily true to scale. Rather, comparatively small elements and in particular layer thicknesses can be represented exaggeratedly large for clarification.

Figure 1:
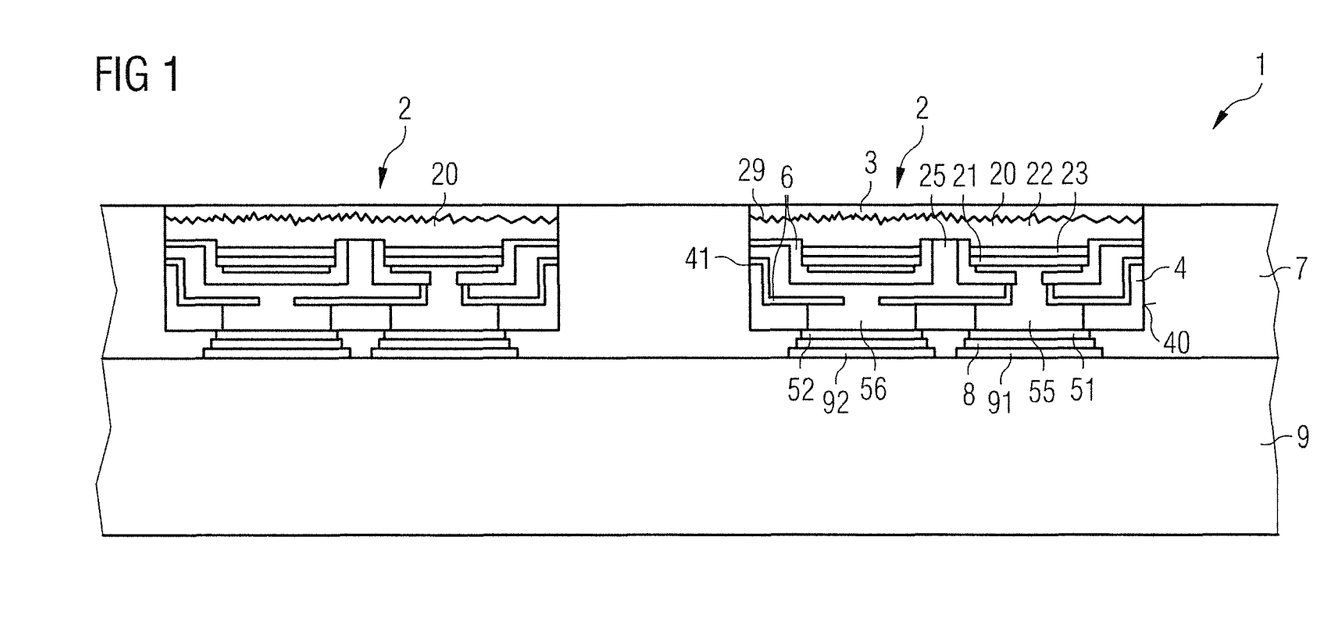
FIGS. 1 to 3 each show an example of a device in a schematic section view.

FIG. 1 shows a first examples of a device 1 comprising a plurality of optoelectronic semiconductor components 2. For a simplified representation, FIG. 1 only shows a section of the device having two optoelectronic semiconductor components. However, the device can also have more than two such optoelectronic semiconductor components. These can be arranged, for example, in a row or in the form of a matrix.

The optoelectronic semiconductor components 2 are each arranged on a connection carrier 9. For example, the connection carrier is a circuit board, for example, a printed circuit board.

The optoelectronic semiconductor component 2 comprises a semiconductor body 20 having an active region 23 that generates radiation. The semiconductor body 20 extends in a vertical direction between a radiation passage face 28 and an underside 27.

The optoelectronic semiconductor component 2 further comprises a molded body 4, through which a first electrical contact 55 and a second electrical contact 56 that electrically contact the semiconductor body extend. The first electrical contact 55 and the second electrical contact 56 electrically conductively connect to a first connection face 91 or a second connection face 92 of the connection carrier 9 so that, when an external electrical voltage is applied between the first connection face 91 and the second connection face 92, charge carriers are injected from opposite sides into the active region 23 and recombine there, emitting radiation.

The molded body 4 has a side face 40 delimiting the semiconductor component in a lateral direction. The connection carrier 9 and the side face 40 of the molded body 4 are covered by a radiation-impermeable cover layer 7.

On a side facing away from the connection carrier 9, the molded body 4 is delimited by an upper edge 41. Viewed from the connection carrier along the vertical direction, the molded body does not extend beyond the upper edge at any point. The upper edge 41 runs in the vertical direction between the connection carrier 9 and the radiation passage face 28 of the optoelectronic semiconductor component 2.

In the vertical direction, the cover layer, viewed from the connection carrier 9, runs at least as far as the upper edge 41 of the molded body. By the cover layer 7, it is prevented that radiation emitted by the optoelectronic semiconductor component 2 is reflected back, for example, on a housing of the device 1 such as a light housing, or that radiation from an adjacent semiconductor component impinges on the side face 40 of the molded body 4. The risk of aging of the material of the molded body due to radiation exposure can thus be avoided. Thus, no or at least only slight aging of the material of the molded body 4 occurs. In particular, visual changes of the molded body and loss of the mechanical stability of the molded body can be avoided or at least reduced.

A radiation conversion element 3 is optionally arranged on the semiconductor body, the radiation conversion element 3 being provided for at least partial conversion of the radiation generated in the active region. For example, the active region generates radiation in the blue spectral range, and the radiation conversion element partially converts this primary radiation into secondary radiation in the yellow spectral range so that the optoelectronic semiconductor component taken as a whole emits mixed light appearing white to the human eye.

The cover layer 7 surrounds the radiation conversion element 3 in the lateral direction at least in regions, in particular along the entire circumference. A side face 30 of the radiation conversion element is completely covered by the cover layer 7 so that a lateral radiation exit from the radiation conversion element 3 can be suppressed. The cover layer 7 that laterally covers the radiation conversion element 3 restricts the radiation exit from the radiation conversion element 3 to the top side thereof facing away from the semiconductor body 20. A lateral radiation exit, which would increasingly lead to the emission of secondary radiation, is avoided by the cover layer. Furthermore, the cover layer also covers a side face 200 of the semiconductor body 20. The radiation generated in the active region 23 therefore has to pass through the radiation conversion element 3. An additional radiation exit of the primary radiation laterally past the radiation conversion element 3 is suppressed by the cover layer 7.

A default color locus of the radiation to be emitted during operation can thus be achieved in a simplified manner by the cover layer, in particular in conjunction with the optoelectronic semiconductor component described. By the cover layer 7, therefore, not only aging of the molded body 4 is suppressed. The spectral emission properties of the device 1 are also improved.

The cover layer 7 preferably comprises a silicone, a particle-filled glass or an inorganic-organic hybrid material, for example, an inorganic-organic hybrid polymer. Suitable hybrid polymers are marketed, for example, under the brand name Ormocere by the Fraunhofer-Gesellschaft zur Forderung der angewandten Forschung e.V., Germany. To increase the reflectivity of the cover layer 7, the cover layer can be filled with particles, for example, white pigments such as titanium dioxide particles or zinc oxide particles.

Preferably, reflectivity of the cover layer for the radiation generated in the active region is at least 60%, particularly preferably at least 80%, for example, 90% or more. The higher the reflectivity, the lower can be absorption losses due to radiation absorption on the cover layer.

A material that would itself have a lower aging stability under the influence of radiation can thus be used for the molded body 4. In addition, the material of the molded body 4 can also be absorbing for the radiation generated in the active region 23 without resulting in losses in the efficiency of the device 1. For example, the material of the molded body can be chosen with regard to a simplified processing, in particular by a casting method especially to improve the temperature stability, for example, during soldering of the optoelectronic components 2, or with regard to its cost-effective availability. For example, an epoxy material is suitable for the molded body.

In the example shown in FIG. 1, the optoelectronic semiconductor components 2 each connect to the connection carrier 9 by a connecting means 8. Each connecting means 8 extends between a first contact face 51 of the first electrical contact 55 and the first connection face 91 and between a second contact face 52 of the second electrical contact 56 and the second connection face 92. The cover layer 7 also adjoins the connection means 8.

For example, solder or an electrically conductive adhesive is suitable for the connecting means.

Details of particularly suitable optoelectronic semiconductor components 2 are explained in more detail in connection with FIGS. 4 to 6. The optoelectronic semiconductor components 2 are in particular suitable for devices 1 according to one of the examples described in connection with FIGS. 1 to 3.

Figure 2:
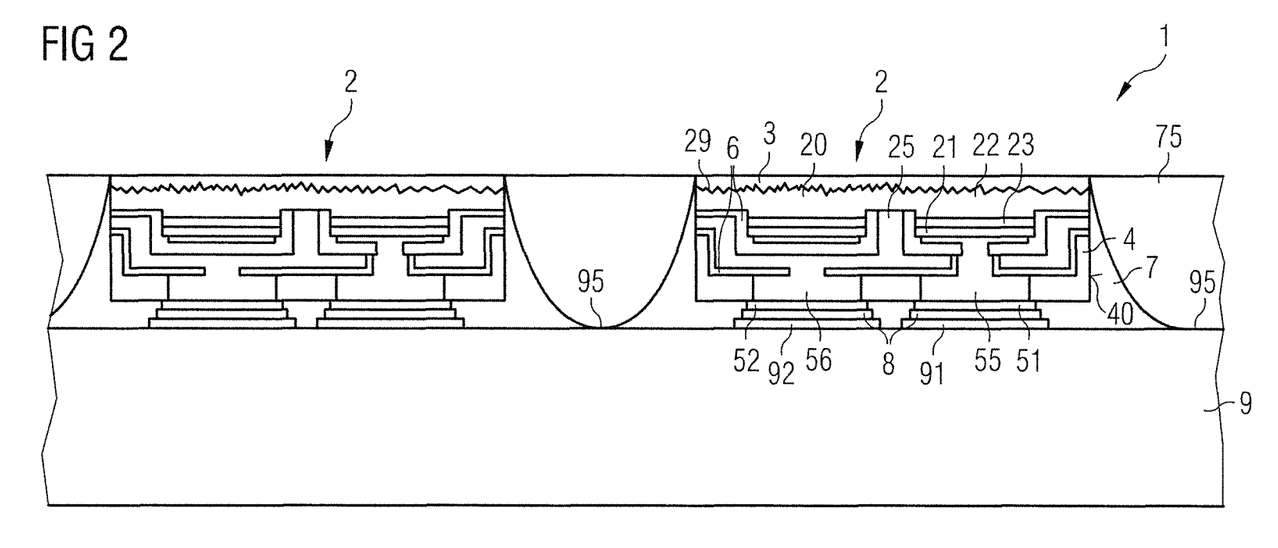

FIG. 2 shows a second example of a device 1. This second example corresponds essentially to the first example described in connection with FIG. 1. In contrast to this, the cover layer 7 does not completely cover the connection carrier 9. In a region 95 of the connection carrier, the connection carrier is free of the cover layer 7. The cover layer is expediently designed such that each optoelectronic semiconductor component 2 is completely surrounded by the cover layer 7 in the lateral direction. In contrast, between adjacent optoelectronic components and/or in an edge region of the connection carrier 9 outside the optoelectronic semiconductor components 2, the cover layer does not need to be present over the entire surface of the connection carrier. In the regions 95 of the connection carrier, a filling layer 75 optionally adjoins the connection carrier 9. In particular, the filling layer 75 does not directly adjoin one of the optoelectronic semiconductor components 2 at any point. Compared to the cover layer 7, only comparatively little radiation thus impinges on the filling layer 75. Therefore, for the filling layer a material can be used which has a lower reflectivity than the cover layer 7 without significant absorption losses occurring as a result. A more cost-effective material can therefore be used for the filling layer than for the cover layer. In particular, the filling layer can contain a radiation-transmissive material or an absorbent material, for example, a casting material provided with pigments such as a white or black casting material. Suitable casting materials are sold, for example, by the Lackwerke Peters GmbH & Co. KG, Germany.

Figure 3:
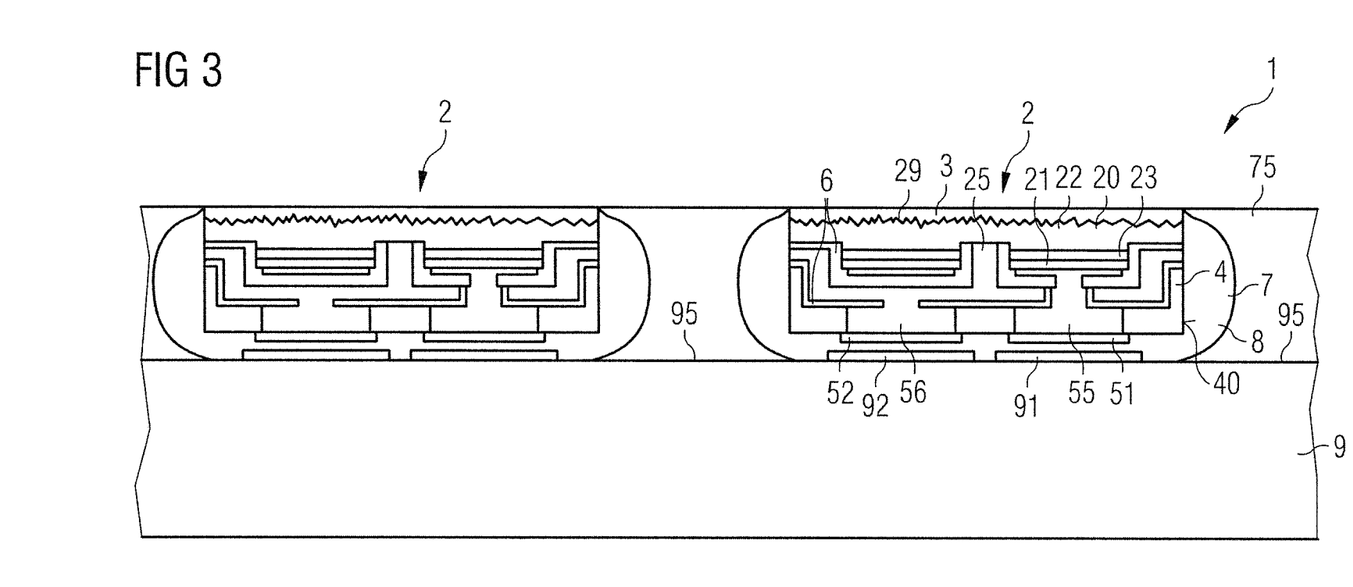

A third example of a device is schematically illustrated in a sectional view in FIG. 3. This example corresponds essentially to the second example described in connection with FIG. 2.

In contrast to this, the cover layer 7 is formed by the connecting means 8, which is arranged between the first contact face 51 and the first connection face 91 as well as between the second contact face 52 and the second connection face 92 of the connection carrier and electrical contacts the optoelectronic semiconductor component 2. The connecting means 8 is an anisotropically conductive connecting means so that an electrical short between the first contact face 51 and the second contact face 52 is avoided.

For production of the electrically conductive connection of the optoelectronic semiconductor components 2 to the connection carrier 9, more material of the connecting means 8 is thus provided than would be necessary for production of an electrically conductive connection alone. The excess connecting means 8 extends over the side faces of the semiconductor component 2, in particular over the side face 40 of the molded body 4 and, thus, forms the radiation-impermeable cover layer 7. Regions 95 of the connection carrier 9, in which the connection carrier is free from the cover layer in a plan view of the device, can be covered with a filling layer 75, as described in connection with FIG. 2.

In this example, electrical contacting of the optoelectronic semiconductor components 2 to the connection carrier 9 and formation of the cover layer to protect the side faces 40 of the molded body 4 are thus effected in a common production step.

Figure 4:
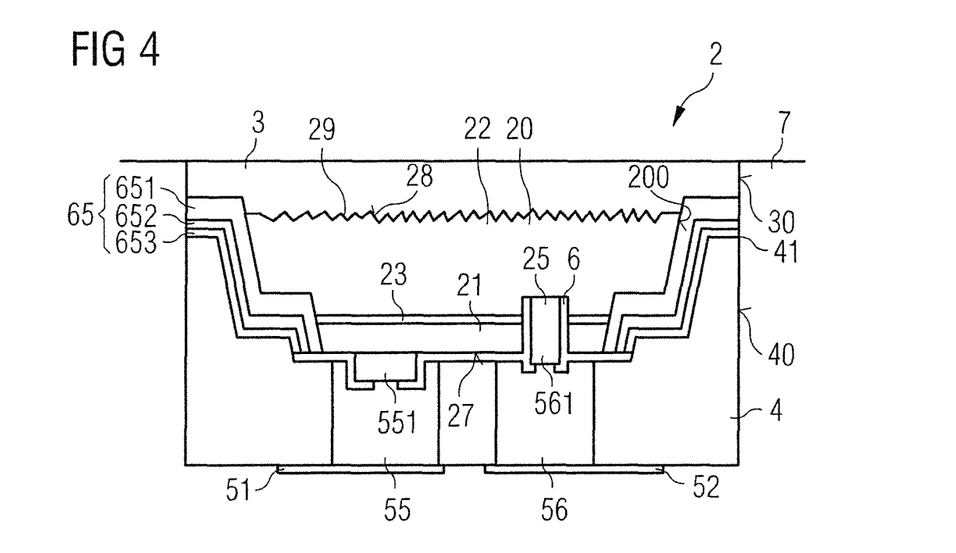
FIGS. 4 to 6 each show an example of an optoelectronic semiconductor component of the device.

FIG. 4 shows an example of an optoelectronic semiconductor component 2 particularly suitable for the described device.

The optoelectronic semiconductor component 2 comprises a semiconductor body 20 formed by an epitaxially grown semiconductor layer sequence. The semiconductor body 20 comprises an active region 23 arranged between a first semiconductor layer 21 of a first conductivity type and a second semiconductor layer 22 of a second conductivity type. For example, the first semiconductor layer 21 is n-conducting and the second semiconductor layer 22 is p-conducting. The semiconductor layers and the active region can each also be multi-layered.

The semiconductor body 20, in particular the active region 23, preferably contains a compound semiconductor material. For example, III-V compound semiconductor materials are suitable for generating radiation in the ultraviolet ($Al_xIn_yGa_{1-x-y}N$) over the visible ($Al_xIn_yGa_{1-x-y}N$, in particular for blue to green radiation, or $Al_xIn_yGa_{1-x-y}P$, in particular for yellow to red radiation) up to the infrared ($Al_xIn_yGa_{1-x-y}As$) spectral range. In each case, $0 \leq x \leq 1$, $0 \leq y \leq 1$ and $x+y \leq 1$ applies, in particular $x \neq 1$, $y \neq 1$, $x \neq 0$ and/or $y \neq 0$. With III-V compound semiconductor materials, in particular from the material systems mentioned, high internal quantum efficiencies can furthermore be achieved for radiation generation.

A growth substrate for the epitaxial deposition of the semiconductor layer sequence of the semiconductor body is removed during production so that the optoelectronic semiconductor component is free of the growth substrate. The molded body mechanically stabilizes the semiconductor body.

A recess 25 is formed in the semiconductor body 20. The recess 25 extends through the first semiconductor layer 21 and the active region 23 into the second semiconductor layer 22. The recess 25 is surrounded along its entire circumference in the lateral direction by material of the semiconductor body.

A vertical extent of the semiconductor body 20 between the radiation passage face 28 and the underside 27 is preferably 2 μm to 20 μm.

A second contact layer 561 is arranged in the recess 25 to electrically contact the second semiconductor layer 22. The second contact layer 561 electrically conductively connects to the second electrical contact 56. Only for a simplified representation, the semiconductor body 20 has only one recess 25. However, the semiconductor body can also have a plurality of such recesses 25 to improve the homogeneity of the lateral current injection.

Furthermore, a first contact layer 551 is arranged on the first semiconductor layer 21. The first contact layer 551 electrically conductively connects to the first electrical contact 55.

The first electrical contact 55 and the second electrical contact 56 extend in the vertical direction completely through the molded body 4. A first contact face 51 and a second contact face 52 that electrically contact the optoelectronic semiconductor component 2 are arranged on a side of the semiconductor component 2 facing away from a radiation passage face 28. The first electrical contact 55 and the second electrical contact 56 are preferably formed of a layer deposited on the semiconductor body 2. A connecting layer such as a solder layer or an adhesive layer between the semiconductor body and the electrical contacts is therefore not required.

During production of the optoelectronic semiconductor components 2, the latter are produced in a composite wherein a molding compound for the molded body 4 is applied to the composite and the first electrical contacts 55 and the second electrical contacts 56 of the optoelectronic semiconductor components 2 are encased, for example, by a casting method. Each individual molded body formed onto one first electrical contact and on one second electrical contact arise only during singulation of the composite into the semiconductor components 2. The side faces 40 of the molded body 4 can therefore have traces of the singulation method, for example, traces of a mechanical method such as sawing tracks, traces of a laser separation method or traces of a chemical method, for instance dry or wet chemical etching.

Preferably, in a plan view of the semiconductor component 2, a base area of the molded body 4 is at most 50% larger than a base area of the semiconductor body 20. The optoelectronic semiconductor component 2 is thus distinguished by a particularly compact design.

The molded body 4 surrounds the semiconductor body 20 in the lateral direction at least in places, in particular along the entire circumference.

Viewed in the vertical direction, an upper edge 41 of the molded body 4 extends between the underside 27 of the semiconductor body 20 and the radiation passage face 28 of the semiconductor body.

A blocking layer 65 is arranged between the molded body 4 and the semiconductor body 20. The blocking layer 65 or at least one partial layer of the blocking layer adjoining the semiconductor body 20 is expediently designed to be electrically insulating. In the example shown, the blocking layer is designed in a multi-layer fashion. The blocking layer 65 comprises a dielectric layer 651, which adjoins the semiconductor body 20. The dielectric layer 651 preferably has a low refractive index, for example, a refractive index of at most 1.4, preferably a refractive index of at most 1.3. A dielectric layer having a lower refractive index, for example, 1.2 or less, can also be used. The lower the refractive index, the higher the proportion of the radiation reflected at the blocking layer on account of total reflection.

The blocking layer furthermore has a dielectric mirror 652. The blocking layer 65 furthermore includes a mirror layer 653. The mirror layer can in particular be metallic. A metallic mirror layer is characterized, in particular compared to a dielectric mirror, by a comparatively small angle dependency.

The blocking layer 65 is configured to suppress emittance of the radiation generated in the active region 23 through a side face 200 of the semiconductor body 20. Furthermore, the blocking layer 65 prevents radiation from impinging on the molded body 4.

After the cover layer 7 has been formed, the blocking layer 65 adjoins the cover layer. The risk of radiation-induced aging of the molded body 4 can thus be largely avoided.

Of course, the blocking layer 65 can have only one or two of the described partial layers as long as the blocking layer is opaque to radiation. The blocking layer preferably has a reflectivity of at least 60% for the radiation generated in the active region 23, particularly preferably at least 80%, for example, 90% or more.

Furthermore, the optoelectronic semiconductor component 2 comprises one or more insulation layers 6, for example, to avoid an electrical short between the second contact layer 561 and the first semiconductor layer 21 in the region of the recess 25.

To increase the coupling-out efficiency, the radiation passage face 28 of the semiconductor body 20 has a structuring 29, for example, in the form of a roughening.

As described in connection with FIG. 1, the cover layer 7 preferably also covers the side faces 30 of the radiation conversion element 3 to avoid lateral radiation exit. However, it can also be sufficient to protect the molded body from incident radiation when the cover layer 7 covers, in particular completely, only the side faces 40 of the molded body.

Figure 5:
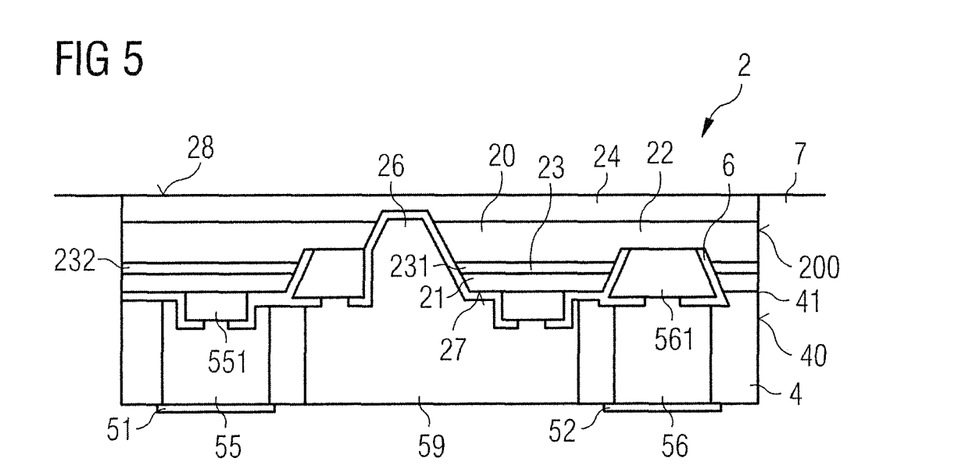
Figure 6:
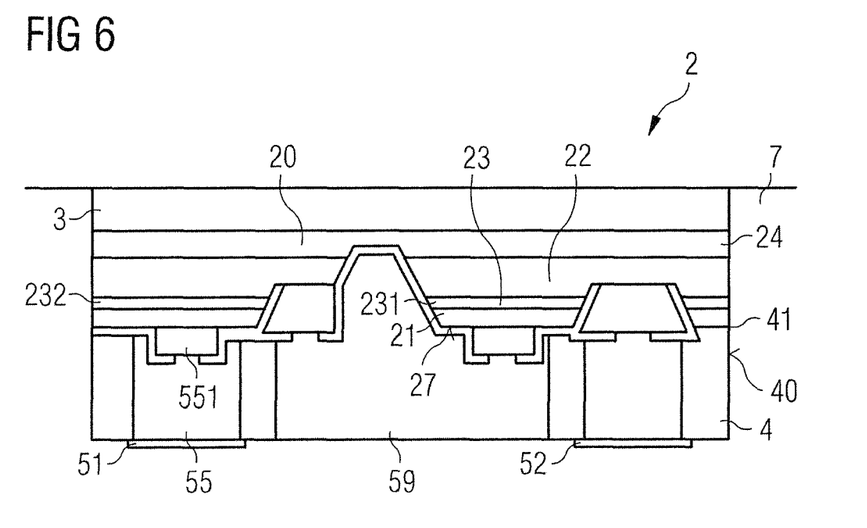

FIG. 5 schematically shows a sectional view of a second example of an optoelectronic semiconductor component. In contrast to the example illustrated in FIG. 4, no radiation conversion element 3 is arranged on the semiconductor body 20. The cover layer 7 can run up to the height of the radiation passage face 28 of the semiconductor body 20 to avoid lateral radiation exit. However, to protect the molded body from incident radiation, it is sufficient if the cover layer 7 only covers the side face 40 of the molded body 4, in particular completely.

In contrast to the example shown in FIG. 4, a side face 200 of the semiconductor body 20 is furthermore completely free of the molded body 4. The molded body 4 extends exclusively on an underside 27 of the semiconductor body 20 opposite the radiation passage face 28.

The semiconductor body 20 and the molded body 4 can terminate flush in the lateral direction. However, the molded body can also have a greater lateral extent than the semiconductor body.

The optoelectronic semiconductor component 2 shown in FIG. 5 furthermore has a separating trench 26 that divides the active region into a first segment 231 and a second segment 232. The segments electrically interconnect in series via an internal connection 59. During production, the internal connection 59, the first contact 55 and the second contact 56 can be produced in a common step.

Of course, the optoelectronic semiconductor component 2 can also contain only one segment, that is to say, as in the example shown in FIG. 4, a continuous active region, or more than two such segments connected at least partially to one another in series and/or parallel to one another.

The separating trench 26 severs the first semiconductor layer 21, the active region 23 and the second semiconductor layer 22. The semiconductor body is formed in a continuous manner only via a further semiconductor layer 24. The conductivity of the further semiconductor layer 24 is expediently so low that there is no significant current flow between the individual segments of the semiconductor body via the further semiconductor layer 24. Alternatively, the semiconductor body 20 can also be completely severed between the segments.

In this configuration as well, a radiation conversion element can be provided on the semiconductor body 20. This is shown in FIG. 6.

The above description of the examples merely takes place for the sake of simplicity for optoelectronic semiconductor components that generate radiation. Alternatively, it is also possible to provide at least one optoelectronic semiconductor component suitable for receiving radiation. In this case, the specified radiation-related properties of the device 1, for example, the mentioned reflectivities, relate to the radiation to be received.

With the cover layer 7, in particular in conjunction with the optoelectronic semiconductor components 2 described, a device can be produced in a particularly simple and cost-effective manner, the device being distinguished at the same time by a high aging stability and good emission properties.

This application claims priority of DE 10 2015 120 642.0, the subject matter of which is incorporated herein by reference.

Our devices and methods are not restricted by the description on the basis of the examples. Rather, this disclosure encompasses any new feature and also any combination of features including in particular any combination of features in the appended claims, even if the feature or combination itself is not explicitly shown in the claims or the examples.

The invention claimed is:

1. A device comprising a plurality of optoelectronic semiconductor components, a blocking layer, and a connection carrier on which the optoelectronic semiconductor components are arranged, wherein
    the optoelectronic semiconductor components each have a semiconductor body comprising an active region configured to generate and/or receive radiation;
    the optoelectronic semiconductor components have a molded body through which a first electrical contact and a second electrical contact to electrically contact the semiconductor bodies are fed;
    the molded body has a side face delimiting the semiconductor components in a lateral direction;
    the connection carrier and the side face of the molded body are covered at least in regions by a radiation-impermeable cover layer;
    the blocking layer is arranged at least in regions between the semiconductor bodies and the molded body; and
    the blocking layer surrounds the semiconductor body at least in places in the lateral direction and the blocking layer adjoins the covering layer.

2. The device according to claim 1, wherein the cover layer has a reflectivity of at least 80% for the radiation generated or to be received in the active regions during operation.

3. The device according to claim 1, wherein the side face of the molded body is covered by the cover layer along an entire circumference of the molded body.

4. The device according to claim 1, wherein a radiation conversion element is arranged on the semiconductor bodies, the conversion element at least partially converting the radiation generated in the active regions, and the cover layer surrounds the radiation conversion element at least in regions in the lateral direction.

5. The device according to claim 1, further comprising a connecting means via which the first electrical contact electrically conductively connects to a first connection face of the connection carrier and the second electrical contact electrically conductively connects to a second connection face of the connection carrier.

6. The device according to claim 5, wherein the cover layer adjoins the connecting means in places.

7. The device according to claim 5, wherein the connecting means is an anisotropically conductive connecting means and the covering layer is formed by the connecting means.

8. The device according to claim 1, wherein in at least one region the connection carrier is free of the cover layer and the device further comprises a filling layer adjoining said region and the cover layer.

9. The device according to claim 1, wherein, in a plan view of the semiconductor components, a base area of the molded body is at most 50% greater than a base area of the semiconductor bodies.

10. The device according to claim 1, wherein the molded body surrounds the semiconductor bodies at least in places in the lateral direction.

11. The device according to claim 1, wherein side faces of the semiconductor bodies are completely free of the molded body.

12. The device according to claim 1, wherein the molded body comprises an epoxy material and the cover layer comprises a silicone, a particle-filled glass or an inorganic-organic hybrid material.

13. The device according to claim 1,
wherein the semiconductor bodies each comprise a recess extending through the respective active region which is surrounded in the lateral direction along its entire circumference by a material of the respective semiconductor body, and
the semiconductor bodies connect to the first electrical contact via the respective recess.

14. The device according to claim 1, wherein the blocking layer avoids an impinging of the radiation generated in the active region on the face of the molded body which faces the semiconductor body.

15. A device comprising at least one optoelectronic semiconductor component, a blocking layer, and a connection carrier on which the optoelectronic semiconductor component is arranged, wherein the optoelectronic semiconductor component has a semiconductor body comprising an active region configured to generate and/or receive radiation;

the optoelectronic semiconductor component has a molded body through which a first electrical contact and a second electrical contact that electrically contact the semiconductor body are fed;

the molded body has a side face delimiting the semiconductor component in a lateral direction;

the connection carrier and the side face of the molded body are covered at least in regions by a radiation-impermeable cover layer;

the blocking layer is arranged at least in regions between the semiconductor bodies and molded body; and the blocking layer surrounds the semiconductor body at least in places in the lateral direction and the blocking layer adjoins the covering layer.

* * * * *